Dec. 4, 1962 H. ZIMMERMAN ETAL 3,067,394

CARRIER WAVE OVERLOAD PROTECTOR HAVING VARACTOR DIODE
RESONANT CIRCUIT DETUNED BY OVERVOLTAGE

Filed July 22, 1960

INVENTORS
HARRY ZIMMERMAN
IRWIN SHARE

BY Daniel P. Chernoff

THEIR ATTORNEY

United States Patent Office 3,067,394

Patented Dec. 4, 1962

3,067,394

CARRIER WAVE OVERLOAD PROTECTOR HAVING VARACTOR DIODE RESONANT CIRCUIT DETUNED BY OVERVOLTAGE

Harry Zimmerman, Forest Hills, and Irwin Share, Brooklyn, N.Y., assignors to Polarad Electronics Corporation, Long Island City, N.Y., a corporation of New York Filed July 22, 1960, Ser. No. 44,742
5 Claims. (Cl. 333—17)

Figure 1:
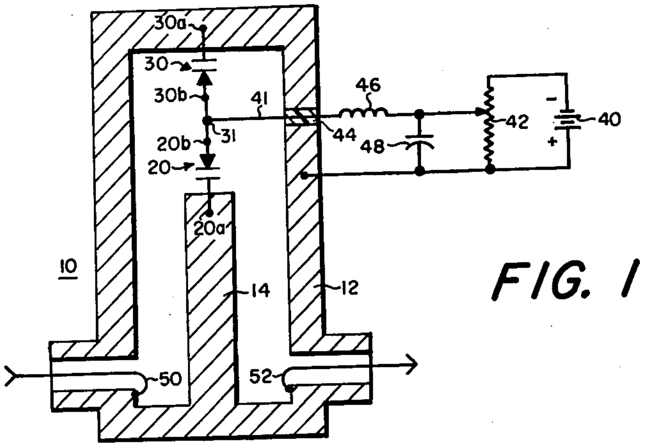

This invention is concerned with microwave systems, and more particularly, with new and novel overload protective means for preventing thermal burnout of sensitive elements contained within such systems.

It is frequently desirable in ultra-high frequency techniques, i.e., those frequencies in the microwave region of the electromagnetic spectrum above about 500 megacycles per second, to have at the input of a device such as a receiver, protective means for preventing high signal levels from passing on to the sensitive circuit elements of the receiver and at the same time permitting low level signals to pass through the protector element without introducing any significant attenuation or degradation of the information content of the signal. Conventional thermal overload elements such as fuses, bimetallic strips, and the like, although satisfactory for relatively gradual increases in signal level which exceed a certain predetermined design capacity of the receiver, may not operate with sufficient rapidity to afford protection if instantaneous high power signal levels are applied to the high frequency system. Thus, for example, if the duplexer arrangement of a radar transmitter-receiver installation should fail or an extremely high signal input level should otherwise occur, protective means must be provided in the receiver for preventing the overdriving of critically tuned elements and thermal burnout of highly sensitive crystal detectors, mixers, etc. The present invention provides such a means wherein a novel overload protector at the input circuit of a high frequency system will permit the passage of low level signals without significant attenuation or degradation of information content, while high level signals will be substantially rejected automatically.

In accordance with the principles of the invention, two voltage-variable capacitance elements, or varactor diodes as they are often called, are electrically connected (in a small-signal-compensation arrangement which will be described subsequently) into the tuned cavity or preselector circuitry at the input of a microwave receiver system, in such a manner that microwave signals propagating therethrough will cause induced voltages to be developed across the varactor elements, thereby altering their capacitance characteristics in relation to the magnitude and polarity of the applied signal. Since the resonant frequency of the tuned cavity is determined by its overall circuit inductive and capacitive reactance including the capacitance associated with the varactor diodes, any net change in the capacitance parameters of the diodes will necessarily lead to a corresponding change in the overall cavity capacitance and thus in the resonant frequency. When the incident signal levels are relatively low, the induced voltages in the varactor diodes do not cause any significant change in the net capacitance value of the two elements because of the compensation arrangement, and thus there will be but a slight, if any, shift, in the resonant frequency of the cavity circuit for such signals. Large signal levels will, however, cause the net varactor capacitance parameter to change radically since the large voltages induced by the propagating microwave energy will exceed the small signal compensation capabilities of the protector circuit. Such large signals will, by the force of the radical change introduced in the net varactor diode capacity, necessarily change the resonant frequency of the overall cavity, thus detuning the tank circuit for the frequency of these large level signals and thereby effectively resulting in a rejection of the incident signal through the introduction of substantial reflection and attenuation. This detuning phenomenon in the input circuitry occurs at such a rapid rate that timely rejection of the large level signals takes place before thermal burnout of sensitive circuit elements in the remainder of the receiver system.

Although it may be possible to employ other electronically variable reactance elements in place of the varactor diodes to accomplish receiver overload protection in accordance with the principles of the present invention, it is believed that the varactor approach is the most feasible from a design standpoint in that it involves only the utilization of relatively low voltages and currents, has low insertion loss in the receiver system, and is relatively insensitive to temperature changes.

Accordingly, it is therefore an objective of this invention to provide new and novel means for protecting sensitive microwave receiver systems from overload and burnout.

Another objective of this invention is to provide a receiver overload protector employing an electronically variable reactance element which operates with sufficient rapidity to avoid deleterious effects on the receiver upon the instantaneous application of high signal power levels.

Still another objective of this invetnion is to provide an overload protector for microwave receiver systems which automatically detunes the resonant frequency of the input cavity of the receiver system upon the incidence of signal power levels exceeding a certain predetermined level without significantly attenuating or degrading signals below said level.

Yet another objective of this invention is to provide a compensated overload protector for microwave receiver systems which automatically detunes the resonant frequency of the input cavity of the receiver system upon the incidence of relatively large signal levels while maintaining the cavity in a tuned state for relatively low level signals.

A further objective of this invention is to provide a new and novel microwave receiver overload protector employing varactor diodes which is relatively insensitive to temperature changes, involves only the utilization of relatively low voltages and currents for control, results in a minimum of insertion loss, and operates with a greater degree of rapidity than conventional thermal protective devices.

Figure 3:
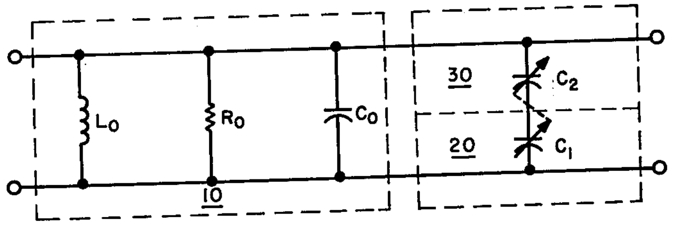
Figure 2:
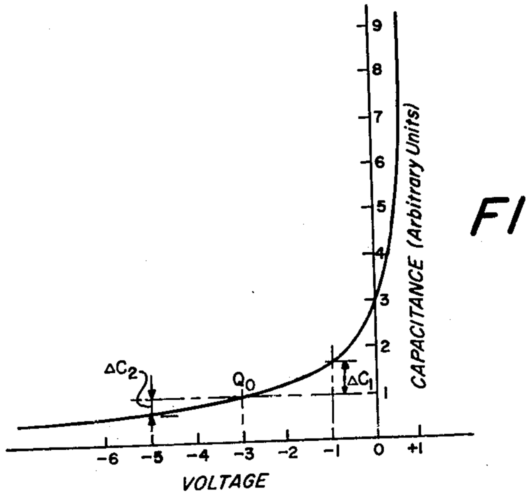

Other objectives and advantages of this invention may be realized by referring to the accompanying drawings and annexed specification in which FIGURE 1 is a cross-sectional, partially diagrammatic, view of an embodiment of the invention showing its construction, and FIGURE 2 is a typical curve of the capacitance vs. voltage characteristics of a varactor diode which will prove helpful in explaining the operation and certain features of the invention, and FIGURE 3 is a schematic diagram of a simplified equivalent circuit of this embodiment of the invention which will be particularly useful in illustrating the theory of its operation.

Referring now to FIGURE 1, details of the construction of the cavity circuit in accordance with the principles of this invention are shown. The cavity tank circuit which typically may be a preselector for a microwave receiver system comprises a coaxial cavity resonator 10 having an outer conductor 12, an inner conductor 14, and radio frequency probes or couplings 50 and 52 for respectively inserting and extracting ultra-high frequency energy appearing at the input of the receiver system. These elements may be of conventional design and therefore they are not described in great detail. The tuned cavity or preselector 10, although shown in the form of a specific coaxial cavity, may be any of the well known waveguide or coaxial configurations, such as rectangular, circular, etc. Varactor diodes 20 and 30, each having respective first and second terminals, *a* and *b*, are located within the cavity 10 in the series-connected manner indicated. The first terminal 20*a* of varactor diode 20 is affixed to the inner conductor wall 14 of the cavity 10, while its second terminal 20*b* is directly connected to the corresponding second terminal 30*b* of the varactor 30 whose first terminal 30*a* is attached to the outer conductor wall 12 of the cavity 10. The two diodes are each backbiased from the common connection 31 between their respective second terminals 20*b*; 30*b* by means of a suitable variable potential source, such as battery 40 and potentiometer 42, connected to the common point 31 by lead 41 brought through insulating seal 44 in the outer conductor wall 12. Radio frequency choke schematically indicated at 46, which may be for example a non-contacting short, and coupling capacitance 48, which may be adequately presented by the parasitic capacitance between the lead 41 and the outer conductor wall 12, provide the necessary D.C. and RF paths for isolation of the bias supply from the microwave energy propagating through the cavity 10.

Essentially a varactor is a backbiased PN junction diode. Variation of the magnitude of the backbias voltage changes the width of the depletion layer across the junction, thereby varying the capacitance of the diode. The relationship describing this voltage variable capacitance characteristic may be expressed as:

$$C=\frac{C_a}{\sqrt[3]{1-V/k}} \qquad (1)$$

where $C$=capacitance of diode with bias voltage
$C_a$=diode capacitance at zero bias
$V$=bias voltage (negative for reverse voltages)
$k$=a constant (about 0.32 volt at room temperature)

Thus it may be seen that, for negative values of bias voltage in excess of several times $k$, the capacitance C of a varactor diode varies approximately inversely as the cube root of the bias voltage. On the other hand, a practically infinite capacitance is available with a slight forward or positive bias less than, but approaching, the constant $k$. The capacitance vs. voltage curve for a typical varactor diode is shown in FIGURE 2 wherein it may be observed that for backbias voltages somewhat larger than minus one volt, there is a region of flatness where the varactor capacitance C varies rather linearly with the applied bias voltage V.

In operation the cavity is tuned to the desired resonant frequency, $f_0$, by suitable mechanical means such as a shorting element (not shown) or by variation of the bias potential applied to the varactor diodes 20 and 30, thereby changing the net capacitance of the diodes and thus of the overall tuned circuit as will be explained. This may be best understood if reference is now made to FIGURE 3 which shows in schematic form a simplified equivalent circuit of the structure shown in FIGURE 1. The preselector cavity 10 is represented by an equivalent parallel arrangement of inductance $L_0$, resistance $R_0$, and capacitance $C_0$. Varactor diode 30 is represented by a voltage-variable capacitance $C_1$; and varactor 20, by voltage-variable capacitance $C_2$.

The equivalent circuit of a typical varactor diode is normally approximated by a resistor in series with a variable capacitor. The resistance represents the spreading resistance of the diode and is a significant factor in determining the frequency limits of the device; however, for purposes of the discussion of the present invention, the spreading resistance may be conveniently eliminated from the schematic as a simplification, since it contributes no part in the determination of the resonant frequency of the overall tuned circuit.

The resonant frequency of the tuned circuit shown in FIGURE 3 may be expressed as follows:

$$F_0=\frac{1}{2\pi\sqrt{LC_t}} \qquad (2)$$

where $$C_t=C_0+\frac{C_1C_2}{C_1+C_2} \qquad (3)$$

Capacitances $C_1$ and $C_2$ are shown as being reverse ganged to represent that the compensation effect provided by the combination results in variation in the inverse direction of one element when there is variation of the other; in other words, an increase of one capacitance in the compensation arrangement results in a corresponding decrease in value of the other capacitance and vice versa. Thus, for identical varactor diodes arranged in the compensation configuration shown in FIGURE 1, and operating at a bias level such as −3 volts represented by the quiescent point $Q_0$ in FIGURE 2, any increase in the effective bias level of one diode, due to a voltage induced by incident high frequency power passing through the preselector cavity, will result in a corresponding decrease in the effective bias level of the other diode by reason of the back-to-back arrangement of the varactor elements. For illustrative purposes let it be assumed that the microwave energy propagating through the preselector cavity is of sufficient amplitude to induce a voltage of two volts across the respective varactor diode elements, 20 and 30, by reason of the intensity of the electric field in that region of the resonator cavity. Thus, for a given polarity of the propagating signal, diode 20 will experience an incremental bias voltage of two volts added to the level set by the external bias supply and diode 30, by reason of its reverse connection, will have this very same voltage detracted from its effective bias level. In the compensation region indicated in FIGURE 2, for an incremental induced voltage of two volts, the equivalent capacitance $C_1$ of varactor diode 30 will be increased by an incremental amount $\Delta C_1$, whereas the equivalent capacitance $C_2$ of varactor diode 20 will be decreased by an incremental amount $\Delta C_2$ which in the compensation region indicated is approximately equivalent to $\Delta C_1$. Accordingly, over a range of induced voltages established by microwave power propagating through the preselector cavity, the compensation arrangement of the varactor diodes according to the principles of this invention results in no significant change in the net capacitance of the varactor diode combination, $$\frac{C_1C_2}{C_1+C_2}$$

Therefore it follows that the resonant frequency of the overall tuned circuit, as determined by its overall capacitance $C_t$ as defined in Equation 2, will remain substantially unchanged so long as the overload protector device is operating in the compensation region (corresponding to the area of substantial linearity of the varactor diode characteristics). This proposition is provable by straightforward mathematical analysis, wherein for relatively small values of $\Delta C_1$, which are nearly equivalent to $\Delta C_2$, it may be shown that the change in the capacitance of a combination of substantially equivalent varactor diodes is approximately $$\frac{-\Delta C_1{}^2}{C_1+C_2}$$

For large input signals, however, corresponding to microwave power levels exceeding the small signal range normally intended for reception by a highly sensitive microwave system, the resulting induced voltages across the diode elements will introduce a large change in the capacitance of the diode whose bias is shifted poistively (which one depends upon the polarity of electric field in the region of the diodes), but only a small, substantially linear, change in the incremental capacitance of the other varactor diode. Referring to FIGURE 2 this may be readily understand if, for example, an induced voltage on the order of three volts of the polarity indicated be assumed. Thus capacitance $C_1$ of varactor diode 30 will experience an incremental change in capacitance $\Delta C_1$ equal to about two scale units whereas capacitance $C_2$ of varactor diode 20 will experience an incremental change $\Delta C_2$ of only about one half a scale unit. It may then be seen that, outside the compensation region indicated in FIGURE 2, induced voltages will result in rapid detuning of the cavity by reason of the extreme change in the net capacitance, $$\frac{C_1C_2}{C_1+C_2}$$

presented by the varactor diode combination.

By design techniques well known to those familiar with the art, varactor diodes may be selected whose individual and sum capacitance characteristics provide the necessary variation, in accordance with the principles of this invention, in order to detune the resonant tank circuit in a particular situation. To demonstrate the operation of the novel device, a quantitative example with a few assumptions which simplify the analysis (but which are not to be interpreted as in anywise limiting the scope of applicability of this invention) will now be given. Thus, for purposes of explanation, the two varactor diodes 20 and 30 (assumed identical with each possessing the characteristics shown in the curve of FIG. 2) will each be taken to have a quiescent value of capacitance (point $Q_0$) equivalent to $C_0$ (the equivalent capacitance of the cavity 10 alone). Then, from the above discussion, the total capacitance of the over-all resonant circuit combination may be expressed as:

$$C_t=C_0+\frac{C_1C_2}{C_1+C_2}=C_0+\frac{C_0^2}{2C_0}=\frac{3}{2}C_0 \tag{4}$$

Now for the above-mentioned induced bias voltage excursion of 3 volts, which drives the operating point of the diode combination outside the compensation region, diode 20 which is at a new bias level of −6 volts exhibits a capacitance of about one-half its quiescent value or approximately $C_0/2$, whereas the capacitance of diode 30 is increased to about triple its quiescent value or $3C_0$. Hence, $$C_t'=C_0+\frac{C_1'C_2'}{C_1'+C_2'}=C_0+\frac{(3C_0)\left(\frac{C_0}{2}\right)}{3C_0+\frac{C_0}{2}}=\frac{10}{7}C_0$$

The sum capacitance $C_t'$ of the over-all equivalent circuit has thus decreased by about 5%, and therefore the resonant frequency of the tuned circuit, as expressed in Equation 2, is shifted upward by about 2%. For conventional preselector cavities of modest selectivity, this shift is resonant frequency would be sufficient to accomplish the desired rejection of high power level signals incident upon the system. Of course, greater frequency shift and hence signal rejection can be achieved by the choice of suitable diodes of quiescent capacity greater than $C_0$.

The rapid detuning is brought about by the relatively rapid change in the overall capacitance $C_t$, which determines the resonant frequency of the tuned circuit, for signal levels exceeding the compensation region of the varactor diodes employed in the cavity. As detuning occurs, incident microwave energy of frequency $f_0$, corresponding to the zero signal resonant frequency of the cavity 10, will be substantially reflected and attenuated by reason of the mismatch presented by the detuned cavity. This rejection of high power signals above a certain predetermined level (as defined by the limits of the compensation region of the diode characteristics about a given quiescent operating point $Q_0$) takes place with sufficient rapidity to prevent the passage of signals which would otherwise overload and burn out critically tuned and sensitive elements in the remainder of the microwave system. As a consequence the invention operates as a receiver overload protector with provision for presetting the threshold power level, above which incident signals rapidly detune the resonant circuit, by the simple adjustment of the D.C. or zero signal bias level supplied by the external potential source. Further, the protector device need not be replaced everytime the overload feature has come into play (as is true of fuses and similar type thermal burnout elements) since the rejection of high power signal levels by reason of the detuning of the resonant circuit prevents the incident microwave energy from damaging the varactor diode elements as well as the remainder of the system, and thus the device may be utilized an indefinite number of times. In addition, it is to be observed that it is but a simple matter of design technique, well within the purview of those skilled in the art, to select the proper capacitance-voltage characteristics for the respective varactor diode elements utilized in the invention in order to obtain a desired compensation range and threshold level operation. For example, it may sometimes be desirable to employ diodes in the protector which do not have identical characteristics to provide compensation for capacitance changes in other portions of the input circuitry of the system resulting from variation in the incident signal power level. Hence compensation can be supplied by this invention for what would otherwise be fluctuations in the resonant frequency of a tuned cavity due to temperature, magnetic or electric field effects on circuit elements caused by changes in the microwave signal level.

Thus a new and novel protector device for sensitive microwave systems has been disclosed which obtains the objectives stated above. Many variations of this invention will be readily apparent to those skilled in the art who may utilize the principles of the same in embodiments somewhat different than the one specifically illustrated and described herein. Accordingly, it is our desire that the scope of the invention be not deemed limited to such embodiment but solely by the following appended claims.

What is claimed is:

1. An overload protector for a high frequency system comprising a tunable cavity resonator having a predetermined resonant frequency and voltage-variable non-linear capacitance means, said voltage-variable non-linear capacitance means arranged in a compensation configuration inside said cavity resonator such that automatic detuning of said resonant frequency of said cavity resonator occurs upon and by account of the incidence of high frequency signals exceeding a predetermined power level without significant rejection of the passage of signals below said predetermined power level, thereby providing protection for sensitive elements contained within said high frequency system.

2. An overload protector for a high frequency system comprising a cavity resonator having means for supplying high frequency energy thereto and extracting high frequency energy therefrom and two voltage-variable non-linear capacitance diodes arranged in said cavity in a compensation configuration with a common junction therebetween connected to external biasing means for controllably setting an initial capacitance condition across said diodes, said compensation configuration being such that high frequency energy incident upon said cavity above a predetermined signal level causes a relatively large change in the net capacitance of said two diodes, whereas for signals below said predetermined level no substantial change occurs in the net capacitance of said two diodes.

3. An overload protector for a high frequency system comprising a cavity resonator having means for supplying high frequency energy thereto and for extracting high frequency energy therefrom, first and second voltage-variable non-linear capacitance diodes, each having a respective first and second connection, said diodes being positioned inside said cavity resonator, said first connections of said diodes being connected together at a common point electrically coupled to adjustable external-biasing means and said respective second connections being connected to the walls of said cavity resonator, said external-biasing means being adjusted to a predetermined bias level for setting an initial capacitance condition across said diodes, so that high frequency energy incident upon said cavity resonator above a predetermined signal level determined by said bias level causes the net capacitance across said diodes to change substantially, while for incident high frequency energy below said predetermined signal level the net capacitance across said diodes remains substantially constant, whereby the resonant frequency of said resonator is substantially altered on account of and in response to incident high frequency energy above said predetermined signal level.

4. The combination as set forth in claim 3 wherein said first and second diodes have substantially similar electrical characteristics.

5. An overload protector for a high frequency system comprising a tunable cavity resonator having a predetermined resonant frequency, voltage-variable non-linear capacitance means arranged inside said cavity resonator in the propagation path of incident high frequency signals, external biasing means for controllably setting an initial capacitance condition across said capacitance means, such that automatic detuning of said resonant frequency of said cavity resonator occurs upon and by account of the incidence of high frequency signals which exceed a predetermined power level without significant detuning for incident high frequency signals below said predetermined power level and providing thereby protection for sensitive elements contained within said high frequency system.

References Cited in the file of this patent

UNITED STATES PATENTS

| | | |
|---|---|---|
| 2,415,962 | Okress | Feb. 18, 1947 |
| 2,688,731 | Young | Sept. 7, 1954 |
| 2,752,495 | Kroger | June 26, 1956 |
| 2,773,243 | Geldstein et al. | Dec. 4, 1956 |
| 2,884,607 | Uhlir | Apr. 28, 1959 |
| 2,928,056 | Lampert | Mar. 8, 1960 |
| 2,959,778 | Bradley | Nov. 8, 1960 |